(12) United States Patent
Sutherland et al.

(10) Patent No.: US 6,456,136 B1
(45) Date of Patent: Sep. 24, 2002

(54) METHOD AND APPARATUS FOR LATCHING DATA WITHIN A DIGITAL SYSTEM

(75) Inventors: Ivan E. Sutherland, Santa Monica; Scott M. Fairbanks, Mountain View, both of CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/834,772

(22) Filed: Apr. 13, 2001

(51) Int. Cl.[7] .............................................. H03K 3/356
(52) U.S. Cl. ......................... 327/225; 327/215; 327/212
(58) Field of Search ................................. 327/200, 202, 327/203, 208, 210, 215, 218, 219, 225, 212, 211

(56) References Cited

U.S. PATENT DOCUMENTS

| | | | | |
|---|---|---|---|---|
| 4,138,613 A | * | 2/1979 | Tanaka | 327/385 |
| 4,484,087 A | * | 11/1984 | Mazin et al. | 327/203 |
| 5,107,137 A | * | 4/1992 | Kinugasa et al. | 327/203 |
| 5,719,516 A | * | 2/1998 | Sharpe-Geisler | 327/203 |
| 5,963,502 A | * | 10/1999 | Watanabe et al. | 327/141 |
| 6,043,697 A | * | 3/2000 | Jang | 327/299 |

* cited by examiner

*Primary Examiner*—Timothy P. Callahan
*Assistant Examiner*—Terry L. Englund
(74) *Attorney, Agent, or Firm*—Park, Vaughen & Fleming LLP (57) ABSTRACT

A latching data system includes a memory element that is configured to store a data value. A latch input is coupled to the memory element, so that changes in the latch input change the data value stored in the memory element without waiting for an assertion of a clock signal. The system also includes a driver circuit that is configured to drive the data value stored in the memory element onto a latch output. The system additionally includes a clocking circuit that is configured to cause the driver circuit to drive the data value stored in the memory element onto the latch output in response to an assertion of the clock signal.

20 Claims, 6 Drawing Sheets

METHOD AND APPARATUS FOR LATCHING DATA WITHIN A DIGITAL SYSTEM

BACKGROUND

1. Field of the Invention

The present invention relates to the design of a latch for storing data within a digital system. More specifically, the present invention relates to a method and an apparatus for latching data into a memory element in response to a clock signal.

1. Related Art

As the speed of computer systems continues to increase at an exponential rate, circuitry within the computer systems is coming under increasing pressure to operate at faster speeds. One problem in attaining higher speeds relates to the design of latches for storing data between computational operations.

Figure 1:
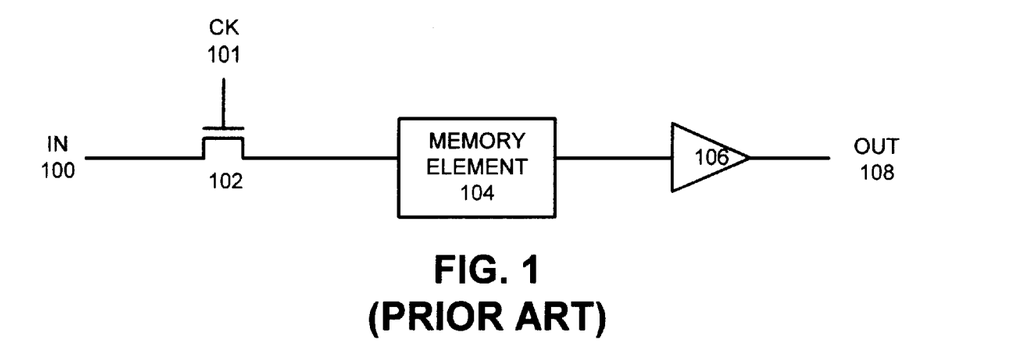
FIG. 1 illustrates a prior art latch circuit.

FIG. 1 illustrates a conventional latching circuit that includes pass transistor 102, memory element 104 and driver 106. This latching circuit receives a data value on input 100 and stores the data value into memory element 104 when clock signal 101 makes pass transistor 102 transparent. This data value is subsequently driven by driver 106 onto output 108.

Memory element 104 is typically a bistable circuit or a capacitive storage element. Hence, input 100 must either overdrive the bistable circuit, or must charge up the capacitive storage element in order to change the value stored in memory element 104. However, in order to overdrive the bistable circuit or charge up the capacitive storage element, pass transistor 102 must drive a significant amount of current into memory element 104. Hence, pass transistor 102 must be sufficiently large to drive this current.

A sufficiently large pass transistor 102 has a large gate region, which creates a significant capacitive load for clock signal 101. Furthermore, note that clock signal 101 may have to drive a large number of latches. Hence, a significant load on each latch can significantly degrade the performance of clock signal 101, or may necessitate a very large driver.

Moreover, in order to keep pace with increasingly faster computer systems, it is desirable for the latch to operate at high speeds and to be able to drive a large amount of current.

What is needed is a method and an apparatus for latching a data value into a memory element in response to a clock signal, which places a minimal capacitive load on the clock signal, while operating at high speeds and driving a large amount of current.

SUMMARY

One embodiment of the present invention provides a system for latching data in response to a clock signal. This system includes a memory element that is configured to store a data value. A latch input is coupled to the memory element, so that changes in the latch input change the data value stored in the memory element without waiting for an assertion of the clock signal. The system also includes a driver circuit that is configured to drive the data value stored in the memory element onto a latch output. The system additionally includes a clocking circuit that is configured to cause the driver circuit to drive the data value stored in memory element onto the latch output in response to an assertion of the clock signal.

In one embodiment of the present invention, the memory element includes a bistable circuit. In a variation on this embodiment, the memory element includes a keeper circuit comprising a first inverter and a second inverter. The first inverter and the second inverter are coupled together into a ring, so that the output of the first inverter is coupled to the input of the second inverter, and the output of the second inverter is coupled to the input of the first inverter.

In one embodiment of the present invention, the memory element includes a capacitive memory element.

In one embodiment of the present invention, the driver circuit includes a P-type transistor and an N-type transistor. The P-type transistor has a source coupled to $V_{DD}$, a drain coupled to the latch output, and a gate coupled through the clocking circuit to a complement of the data value stored n the memory element. The N-type transistor has a source coupled to ground, a drain coupled to the latch output, and a gate coupled through the clocking circuit to the data value stored in the memory element.

In one embodiment of the present invention, the clocking circuit includes a first N-type pass transistor, with a drain coupled to the data value stored in the memory element, a source coupled through an inverter to a gate of a P-type transistor within the driver circuit, and a gate coupled to the clock signal. It also includes a second N-type pass transistor, with a drain coupled to a complement of the data value stored in the memory element, a source coupled to a gate of a N-type transistor within the driver circuit, and a gate coupled to the clock signal.

In one embodiment of the present invention, the clocking circuit includes a domino amplifier that is configured to drive the data value stored in the memory element into the driver circuit when the clock signal is asserted.

In one embodiment of the present invention, the clocking circuit includes an N-type clocking transistor coupled in series with drive transistors in the driver circuit. The gate of this N-type clocking transistor is coupled to the clock signal, so that asserting the clock signal causes the driver circuit to be activated.

In one embodiment of the present invention, the latch input is coupled to the input of a second latch. In this embodiment, the memory element is shared with the second latch and is located at the input of the second latch.

In one embodiment of the present invention, the system additionally includes a turnoff circuit that is configured to turn off the driver circuit after the data value stored in the memory element has been driven onto the latch output. In a variation on this embodiment, the turnoff circuit includes at least one P-type turnoff transistor with a source coupled to $V_{DD}$, a drain coupled to a gate of a drive transistor within the driver circuit, and a gate coupled to a turnoff signal, so activating the turnoff signal causes the driver circuit to turn off. In a variation on this embodiment, the turnoff signal is derived from the latch input. In a variation on this embodiment, the turnoff signal is derived from the clock signal.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

The data structures and code described in this detailed description are typically stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Latch Circuit

Figure 2:
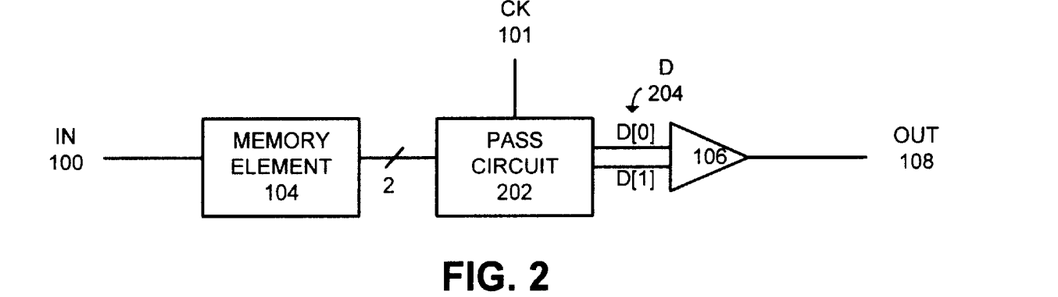
FIG. 2 illustrates a latch circuit in accordance with an embodiment of the present invention.

FIG. 2 illustrates a latch circuit in accordance with an embodiment of the present invention. This latch circuit differs from the prior art latch circuit illustrated in FIG. 1 in that memory element 104 is coupled directly to input 100 without an intervening pass transistor 102. Hence, when the value of input 100 changes, the value stored within memory element 104 changes without having to wait for an assertion of clock signal 101.

Instead of activating a pass transistor located between input 100 and memory element 104, clock signal 101 drives a pass circuit 202 located between memory element 104 and driver 106.

Upon activation of clock signal 101, pass circuit 202 passes the data value stored within memory element 104 to driver 106 in order to drive output 108. Note that output 108 can change the state of a downstream memory element located at the input of a downstream latch.

In another embodiment of the present invention, this downstream latch is moved so that it is located at the output of driver 106, instead of being located at the input of the downstream latch.

By placing pass circuit 202 between memory element 104 and driver 106, pass circuit 202 does not have to drive a significant amount of current to change the state of memory element 104. Instead, pass circuit 202 merely has to drive enough current to drive the capacitive load on the input of driver 106. Hence, clock signal 101 does not have to drive a large pass transistor, which means that the capacitive load on clock signal 101 can be relatively small.

Also note that the output of a preceding drive circuit changes the state of memory element 104 directly without having to feed through a pass transistor.

Figure 8:
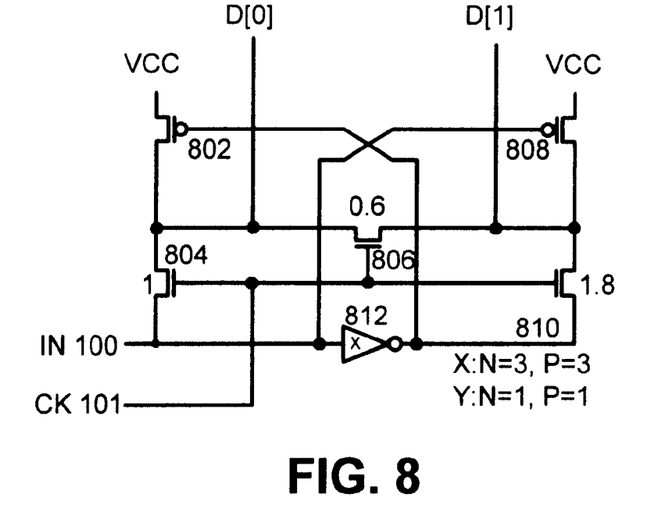
FIG. 8 illustrates a pass circuit in accordance with a further embodiment of the present invention.
Figure 9A:
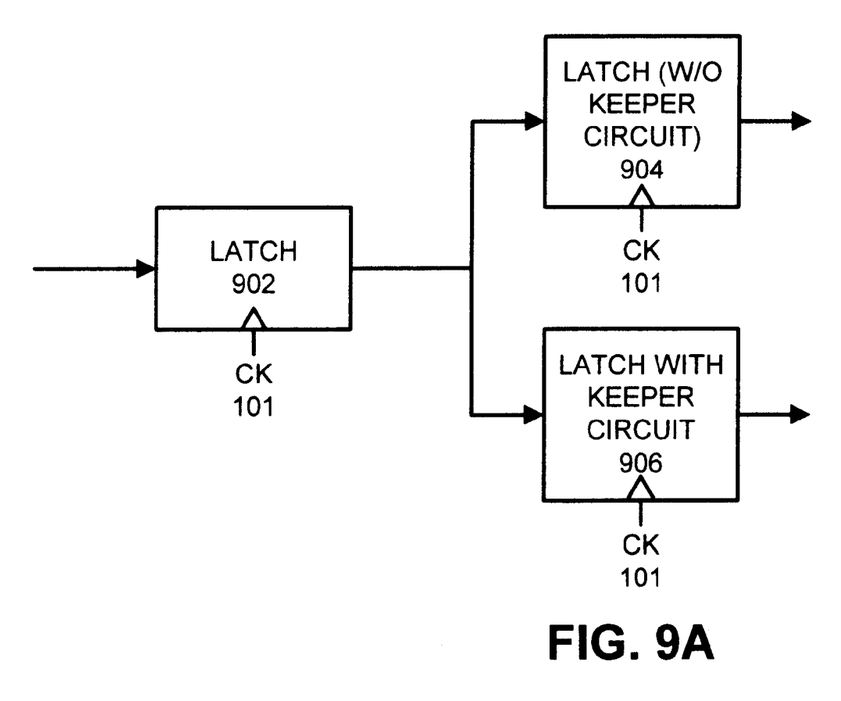
FIG. 9A illustrates a latch driving multiple latches in accordance with an embodiment of the present invention.
Figure 9B:
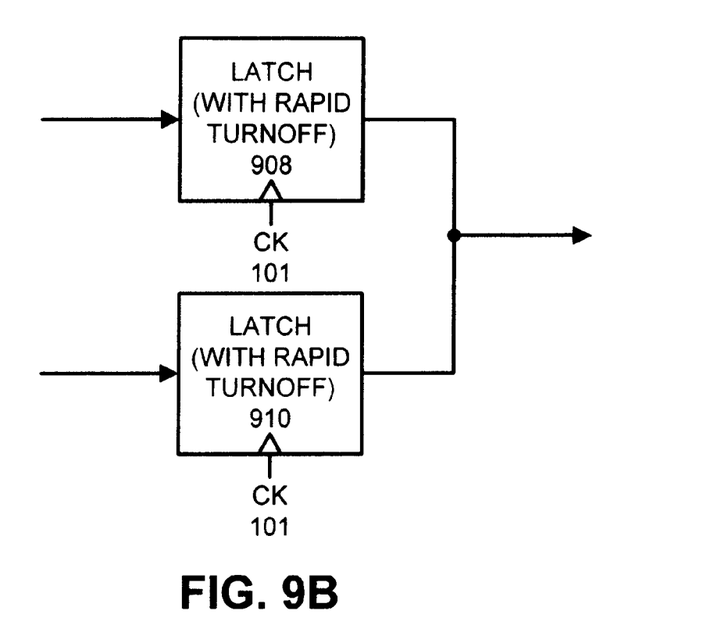
FIG. 9B illustrates multiple latches driving the same signal line in accordance with an embodiment of the present invention.

In the above arrangement, the receiving latch takes responsibility for maintaining the state of the wire between the transmitting latch and the receiving latch. This arrangement permits either of two transmitting latches, 908 and 910, to drive the same receiving latch by simply connecting their output terminals together as is illustrated in FIG. 9B. Of course, one must avoid concurrently transmitting from latches 908 and 910 onto the same signal line. Going the other way, where one transmitting latch drives several receiving latches (as in FIG. 9A), the memory element 104 is omitted on all but one of the receiving latches. A latch without a memory element is illustrated in FIG. 8.

Driver Circuit

Figure 3:
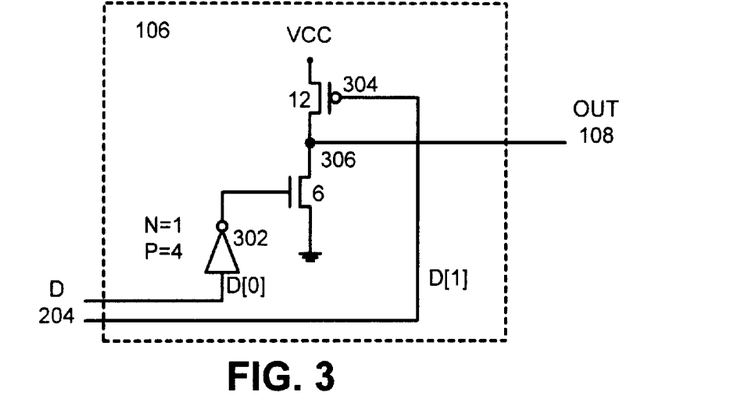
FIG. 3 illustrates a driver circuit in accordance with an embodiment of the present invention.

FIG. 3 illustrates a driver circuit 106 in accordance with an embodiment of the present invention. The driver circuit 106 illustrated in FIG. 3 includes an inverter 302 and separate N-type and P-type drive transistors, 304 and 306. Note that separating the final drive transistors avoids crossover current and speeds operation. Note that D[0] and D[1] are different complementary inputs.

Figure 4:
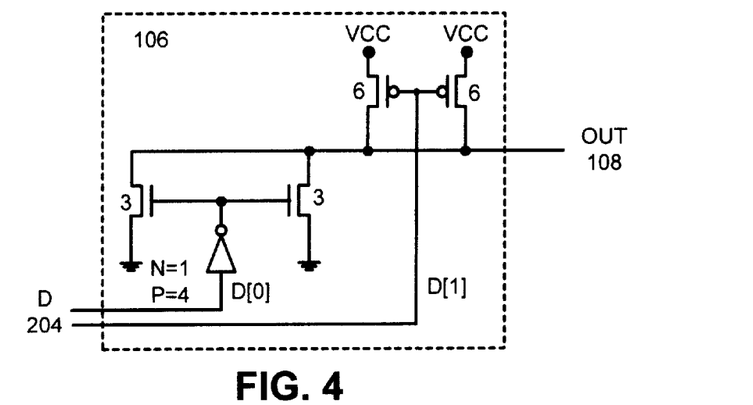
FIG. 4 illustrates a driver circuit in accordance with another embodiment of the present invention.

FIG. 4 illustrates a driver circuit in accordance with another embodiment of the present invention. In this embodiment, each of the drive transistors is split into two parts that are wired in parallel.

The drivers illustrated in FIGS. 3 and 4 each have two separate inputs, D[0] and D[1]. Making both of these inputs high shuts off the driver. Moreover, only one of the inputs goes low at a given to time to force the driver's output to either high or low. More specifically, if D[0] goes low, the driver's output goes to zero (or low), and if D[1] goes low, the driver's output goes to one (or high).

In one embodiment of the present invention, the widths of the main drive transistors are matched to about 500 microns of wire. Because wire has about $\frac{1}{10}^{th}$ the capacitance of gate material, 500 microns of wire present an equivalent capacitive load as 50 microns of gate material. A step-up of three suggests 50/3=16.67, or about 18 microns of total transistor gate width, split two-to-one in favor of P-type. Thus, the P-type drive transistor can be 12 microns wide and the N-type drive transistor can be six microns wide.

Note that the driver illustrated in FIGS. 3 (or FIG. 4) responds quickly to low-going changes at its input. The P-type transistor responds as soon as D[1] reaches one threshold voltage lower than $V_{DD}$. The high-threshold inverter in front of the N-type transistor similarly responds soon after D[0] begins to go low. For the inverter transistors, the narrowest possible transistors can be chosen that make a high-threshold inverter. In one embodiment of the present invention, the N-type is 0.6 microns wide and the P-type is 4 times as wide, or 2.4 microns, or alternatively, the NMOS can be debilitated by increasing its length.

Pass Circuit

Figure 5:
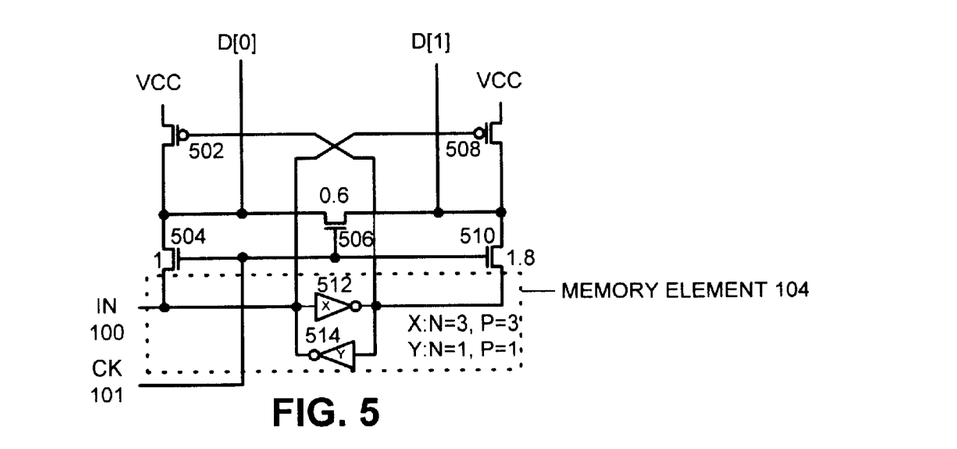
FIG. 5 illustrates a pass circuit in accordance with an embodiment of the present invention.

FIG. 5 illustrates a pass circuit in accordance with an embodiment of the present invention. The two inverters X 512 and Y 514 form a keeper circuit that acts as a memory element. The two N-type transistors 504 and 510 are pass gates that are driven by clock signal 101. When clock signal 101 goes high, pass transistors 504 and 510 pull down either D[0] or D[1], depending on the value of the input 100.

Note that the latch illustrated in FIG. 2 shuts of reluctantly. There are two shut off mechanisms. The first involves the wider P-type transistors 502 and 508. Note that each of these wider P-type transistors 502 and 508 is coupled to input 100 or its complement. Thus, if input 100 is low, the D[ 1] side will not be used, and shuts off via the cross-coupling to P-type transistor 508. On the other hand, if input 100 is high, the D[0] side will not be used, and shuts off via the cross-coupling to P-type transistor 502.

The second shutoff mechanism uses the very narrow P-type transistor 506. When clock signal 101 is low, P-type transistor 506 forces an otherwise undriven side high, shutting off the structure completely.

Figure 6:
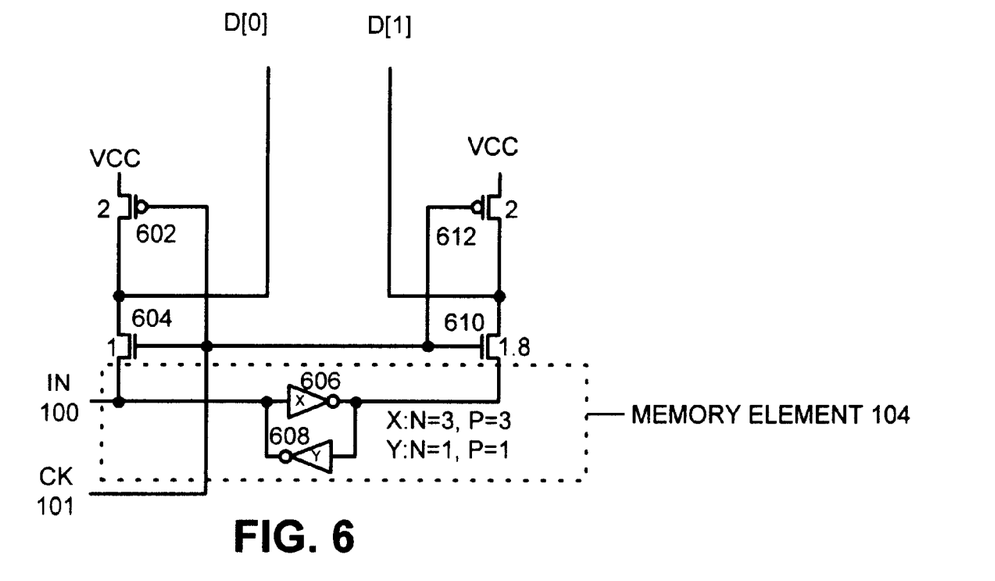
FIG. 6 illustrates a pass circuit in accordance with another embodiment of the present invention.

FIG. 6 illustrates a pass circuit used for rapid shutoff in accordance with another embodiment of the present invention. Here the clock signal 101 drives P-type transistors 602 and 612 that are used for shutoff, as well as the N-type pass transistors 604 and 610. Whenever clock signal 101 is low, both sides shut off promptly. Thus, the latch illustrated in FIG. 6 presents more capacitive load to clock signal 101 than the latch illustrated in FIG. 5 in return for a much more rapid shut off.

Figure 7:
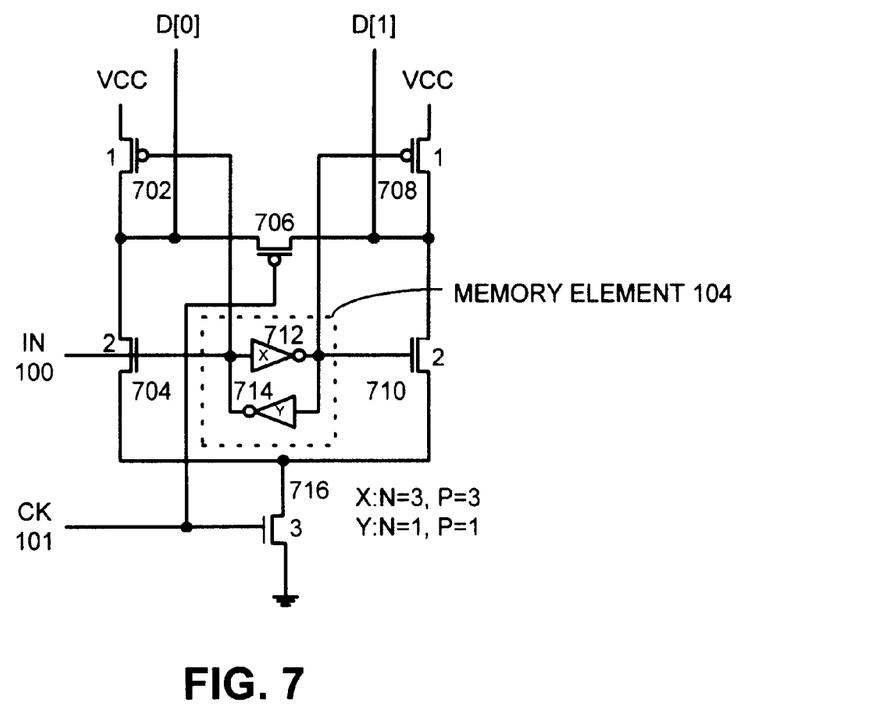
FIG. 7 illustrates a pass circuit in accordance with yet another embodiment of the present invention.

FIG. 7 illustrates a pass circuit with an inverting structure in accordance with yet another embodiment of the present invention. Here input 100 enters a domino amplifier rather than a pass gate structure. This domino structure can be every bit as fast as the pass gate structure, and has the further advantage of avoiding a current drain on input 100. Note that a single N-type transistor 716 can serve both sides of the circuit because only one side draws current at a time. Also note that the cross-coupling required in the latches illustrated in FIGS. 5 and 8 is absent here because of the logic inversion.

FIG. 8 illustrates a pass circuit with the keeper omitted in accordance with a further embodiment of the present invention. The circuit illustrated in FIG. 8 is used when some other structure provides the keeper function. For example, if one latch drives multiple output latches (as in FIG. 9A), the latch illustrated in, FIG. 5 can be used for the first output latch 904, and the latch illustrated in FIG. 8 can be used for the remaining latch 906.

A novel property of the latches illustrated in FIGS. 5, 7, and 8 is their "reluctant shut off" feature. Of course it is important that a latch start driving its output wire promptly upon receipt of a latch control signal. On the other hand, it usually does not matter how long the latch takes to shut off its output drive, particularly if its input signal remains constant. Given an unchanged input signal, a second control input can only renew the same output state anyway, so why hasten to shut off the output drive? The latches illustrated in FIGS. 5, 7 and 8 avoid loading clock signal 101 in order to shut off their output drive. Instead, they use current from input 100 to shut off whichever output side will not be used in the next cycle.

Only the latch illustrated in FIG. 6 shuts off its drive promptly. This rapid shutoff makes this latch suitable for multiplexers as in FIG. 9B, but results in extra capacitive loading on clock signal 101. Note that two of the latches illustrated in FIG. 6 with their outputs coupled together can be used to drive a common successor latch. Of course, the clock signals for the two parallel latches must be mutually exclusive to prevent drive conflicts.

Another Latch Circuit

Figure 10:
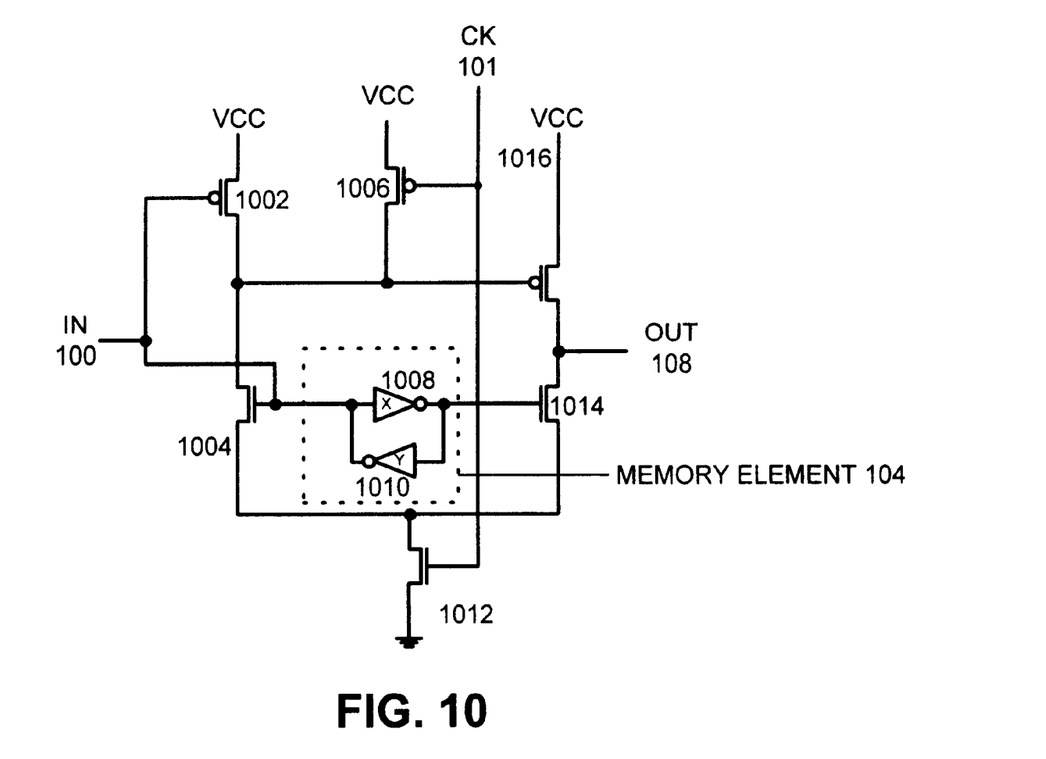
FIG. 10 illustrates a latch circuit in accordance with an embodiment of the present invention.

FIG. 10 illustrates a latch circuit in accordance with another embodiment of the present invention. Note that the latch illustrated in FIG. 10 contains 10 transistors, including transistors for the keeper circuit. Also note that if clock signal 101 is asserted after input 101 changes, there is one gate delay from the assertion of clock signal 101 until a corresponding transition appears at output 108 for a low value and two gate delays for a high value. On the other hand, when input 100 changes while clock signal 101 is asserted, there are two gate delays until the transition appears at output 108 for both high-going and low-going signals.

In the latch illustrated in FIG. 10, clock signal 101 controls N-type transistor 1012. When N-type transistor 1012 becomes transparent, it sources current through one of two N-type transistors 1004 and 1014 depending upon the value of input 100. If input 100 is high, N-type transistor 1012 delivers current to N-type transistor 1004. The drain of N-type transistor 1004 is coupled to the gate of P-type drive transistor 1016, which pulls output 108 high. If input 100 is low, N-type transistor 1012 delivers current to N-type drive transistor 1014. The drain of N-type drive transistor 1014 is coupled to output 108.

Note that N-type transistor 1012 ensures that P-type drive transistor 1016 is turned off when clock signal 101 is not asserted. P-type transistor 1002 ensures that P-type drive transistor 1016 turns off if input 100 changes from high to low while clock signal 101 is asserted.

When neither P-type drive transistor 1016 nor N-type drive transistor 1014 are sourcing output 108, the value on output 108 is maintained by the keeper on a downstream latch.

Figure 11:
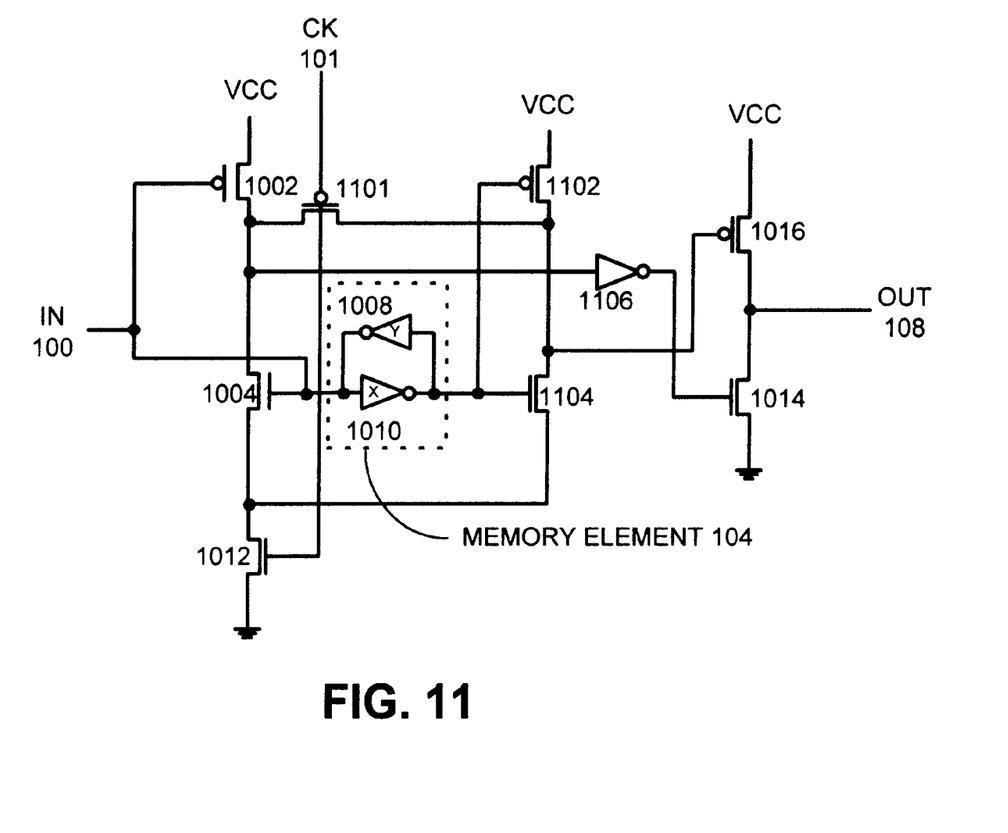
FIG. 11 illustrates a latch circuit in accordance with another embodiment of the present invention.

FIG. 11 illustrates a latch circuit in accordance with another embodiment of the present invention. The latch illustrated in FIG. 11 is the same as the latch illustrated in FIG. 10 except that an extra stage of gain is added. This extra stage of gain causes the latch to invert.

The latch illustrated in FIG. 11 operates in the same manner as the latch illustrated in FIG. 10 except for the way P-type transistor 101 is used. Note that either P-type transistor 1002 or P-type transistor 1102 will be conducting at any given time. P-type transistor 1101 shorts the drains of these two transistors when clock signal 101 is low. This ensures that the drains of both P-type transistors 1002 and 1102 are at a high voltage, which shuts off drive transistors 1016 and 1014.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An apparatus for latching data in response to a clock signal, comprising:

a memory element that is configured to store a data value;

a latch input coupled to the memory element, whereby changes in the latch input change the data value stored in the memory element without waiting for an assertion of the clock signal;

a latch output;

a driver circuit that is configured to drive the data value stored in the memory element onto the latch output; and a clocking circuit that is configured to cause the driver circuit to drive the data value stored in the memory element onto the latch output in response to the assertion of the clock signal;

wherein the clocking circuit includes an N-type clocking transistor coupled in series with drive transistors in the driver circuit, wherein the gate of the N-type clocking transistor is coupled to the clock signal, so that asserting the clock signal causes the driver circuit to be activated.

2. The apparatus of claim 1, wherein the clocking circuit is configured to pass the data value stored in the memory element to the driver circuit in response to the assertion of the clock signal in order to drive the data value onto the latch output.

3. The apparatus of claim 1, wherein the memory element includes a bistable circuit.

4. The apparatus of claim 1,
wherein the memory element includes a keeper circuit comprising a first inverter and a second inverter;
wherein the first inverter and the second inverter are coupled into a ring, so that the output of the first inverter is coupled to the input of the second inverter and the output of the second inverter is coupled to the input of the first inverter.

5. The apparatus of claim 1, wherein the memory element includes a capacitive memory element.

6. The apparatus of claim 1, wherein the driver circuit includes:
a P-type transistor with a source coupled to $V_{DD}$, a drain coupled to the latch output, and a gate coupled through the clocking circuit to a complement of the data value stored in the memory element; and
an N-type transistor with a source coupled to ground, a drain coupled to the latch ottput, and a gate coupled through the clocking circuit to the data value stored in the memory element.

7. The apparatus of claim 1, wherein the clocking circuit includes:
a first N-type pass transistor, with a source coupled to the data value stored in the memory element, a drain coupled through an inverter to a gate of an N-type transistor within the driver circuit, and a gate coupled to the clock signal; and
a second N-type pass transistor, with a source coupled to a complement of the data value stored in the memory element, a drain coupled to a gate of a P-type transistor within the driver circuit, and a gate coupled to the clock signal.

8. The apparatus of claim 1, wherein the clocking circuit includes a domino amplifier that is configured to drive the data value stored in the memory element into the driver circuit when the clock signal is asserted.

9. The apparatus of claim 1,
wherein the latch input of a latch without the memory element is coupled to an input of a latch with the memory element; and
wherein the memory element is shared with the latch without the memory element and is located at the input of the latch with the memory element.

10. The apparatus of claim 1, further comprising a turnoff circuit that is configured to turn off the driver circuit after the data value stored in the memory element has been driven onto the latch output.

11. The apparatus of claim 10, wherein the turnoff circuit includes at least one P-type turnoff transistor with a source coupled to $V_{DD}$, a drain coupled to a gate of a drive transistor within the driver circuit, and a gate coupled to a turnoff signal, so activating the turnoff signal causes the driver circuit to turn off.

12. The apparatus of claim 11, wherein the turnoff signal is derived from the latch input.

13. The apparatus of claim 11, wherein the turnoff signal is derived from the clock signal.

14. A method for latching data in response to a clock signal, comprising:
receiving a change in a latch input;
in response to the change in the latch input, changing a data value stored in a memory element without waiting for the assertion of the clock signal;
receiving an assertion of the clock signal; and
in response to the assertion of the clock signal,
using a driver circuit to drive the data value stored in the memory element onto a latch output, and
turning off the driver circuit after the data value stored in the memory element has been driven onto the latch output,
wherein turning off the driver circuit involves using one of the latch input and the clock signal to turn off the driver circuit.

15. An apparatus for latching data in response to a clock signal, comprising:
a memory element that is configured to store a data value;
wherein the memory element includes a bistable circuit;
a latch input coupled to the memory element, whereby changes in the latch input change the data value stored in the memory element without waiting for an assertion of the clock signal;
a latch output;
a driver circuit that is configured to drive the data value stored in the memory element onto the latch output; and
a clocking circuit that is configured to cause the driver circuit to drive the data value stored in the memory element onto the latch output in response to the assertion of the clock signal;
wherein the driver circuit includes,
a P-type transistor with a source coupled to $V_{DD}$, a drain coupled to the latch output, and a gate coupled through the clocking circuit to a complement of the data value stored in the memory element, and
an N-type transistor with a source coupled to ground, a drain coupled to the latch output, and a gate coupled through the clocking circuit to the data value stored in the memory element; and
a turnoff circuit that is configured to turn off the driver circuit after the data value stored in the memory element has been driven onto the latch output;
wherein the turnoff circuit includes at least one P-type turnoff transistor with a source coupled to $V_{DD}$, a drain coupled to a gate of the P-type transistor within the driver circuit, and a gate coupled to a turnoff signal, so activating the turnoff signal causes the driver circuit to turn off.

16. The apparatus of claim 15,
wherein the memory element includes a keeper circuit comprising a first inverter and a second inverter;
wherein the first inverter and the second inverter are coupled into a ring, so that the output of the first inverter is coupled to the input of the second inverter and the output of the second inverter is coupled to the input of the first inverter.

17. The apparatus of claim 15, wherein the clocking circuit includes:
   a first-N-type pass transistor, with a source coupled to the data value stored in the memory element, a drain coupled through an inverter to a gate of a N-type transistor within the driver circuit, and a gate coupled to the clock signal; and
   a second N-type pass transistor, with a source coupled to the complement of the data value stored in the memory element, a drain coupled to a gate of the P-type transistor within the driver circuit, and a gate coupled to the clock signal.

18. The apparatus of claim 15, wherein the clocking circuit includes a domino amplifier that is configured to drive the data value stored in the memory element into the driver circuit when the clock signal is asserted.

19. The apparatus of claim 15, wherein the clocking circuit includes an N-type clocking transistor coupled in series with the drive transistors in the driver circuit, wherein the gate of the N-type clocking transistor is coupled to the clock signal, so that asserting the clock signal causes the driver circuit to be activated.

20. The apparatus of claim 15,
   wherein the latch input of a latch without the memory element is coupled to an input of a latch with the memory element; and
   wherein the memory element is shared with the latch without the memory element and is located at the input of the latch with the memory element.

* * * * *